(12) United States Patent
Miyoshi (10) Patent No.: US 10,692,744 B2
(45) Date of Patent: Jun. 23, 2020

(54) METHOD OF INSPECTING GAS SUPPLY SYSTEM

(71) Applicant: TOKYO ELECTRON LIMITED, Tokyo (JP)

(72) Inventor: Risako Miyoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 191 days.

(21) Appl. No.: 16/010,530

(22) Filed: Jun. 18, 2018

(65) Prior Publication Data

US 2018/0374727 A1 Dec. 27, 2018

(30) Foreign Application Priority Data

Jun. 23, 2017 (JP) ................. 2017-122875

(51) Int. Cl.
| | |
|---|---|
| *H01L 21/67* | (2006.01) |
| *G05D 11/13* | (2006.01) |
| *G05D 16/20* | (2006.01) |
| *H01J 37/32* | (2006.01) |
| *H01L 21/683* | (2006.01) |

(52) U.S. Cl.
CPC ........ *H01L 21/67253* (2013.01); *G05D 11/13* (2013.01); *G05D 16/2053* (2013.01); *H01J 37/32091* (2013.01); *H01J 37/32449* (2013.01); *H01J 37/32715* (2013.01); *H01J 37/32834* (2013.01); *H01L 21/67017* (2013.01); *H01L 21/67069* (2013.01); *H01L 21/67109* (2013.01); *H01L 21/67248* (2013.01); *H01L 21/6831* (2013.01); *H01J 2237/334* (2013.01); *Y10T 137/2544* (2015.04); *Y10T 137/87169* (2015.04)

(58) Field of Classification Search
CPC ...... Y10T 137/2544; Y10T 137/87169; G05D 16/2053; G05D 11/13; A61B 5/112; H01L 21/67253; H01L 21/67017; H01L 21/67069; H01L 21/67109; H01L 21/67248; H01L 21/6831; H01J 37/32091; H01J 37/32449; H01J 37/32715; H01J 37/32834; H01J 2237/334
USPC ................................. 137/102, 596
See application file for complete search history.

(56) References Cited

U.S. PATENT DOCUMENTS 8,048,687 B2 * 11/2011 Shimizu ............. H01L 21/3105
438/4
8,357,615 B2 * 1/2013 Chiba ............... H01J 37/32522
216/58

(Continued)

FOREIGN PATENT DOCUMENTS

JP 2003-160870 A 6/2003

*Primary Examiner* — William M McCalister
(74) *Attorney, Agent, or Firm* — Studebaker & Brackett PC (57) ABSTRACT

In one embodiment, a vaporizer is connected to a chamber of a substrate processing apparatus through a gas supply line and a gas introduction port. An exhaust device is connected to the gas supply line. The substrate processing apparatus includes a pressure sensor that obtains a measurement value of a pressure of the gas supply line. A method according to the embodiment includes supplying a processing gas to the chamber from the vaporizer through the gas supply line, and monitoring a change of the measurement value obtained by the pressure sensor in a state in which supply of the processing gas to the gas supply line is stopped.

4 Claims, 5 Drawing Sheets

(56) References Cited

U.S. PATENT DOCUMENTS

| | | | | |
|---|---|---|---|---|
| 2012/0031266 | A1* | 2/2012 | Amikura | B01D 53/30 |
| | | | | 95/19 |
| 2013/0137279 | A1* | 5/2013 | Yamamoto | H01L 21/02225 |
| | | | | 438/778 |
| 2016/0281223 | A1* | 9/2016 | Sowa | C23C 16/45544 |
| 2016/0284542 | A1* | 9/2016 | Noda | H01L 21/02274 |
| 2017/0011908 | A1* | 1/2017 | Matsuoka | C23C 16/45531 |
| 2018/0204742 | A1* | 7/2018 | Tateno | H01L 21/67017 |
| 2018/0286727 | A1* | 10/2018 | Ohashi | H01L 21/6838 |

* cited by examiner

METHOD OF INSPECTING GAS SUPPLY SYSTEM

CROSS-REFERENCE TO RELATED APPLICATIONS

This application is based on and claims the benefit of priority from Japanese Patent Application No. 2017-122875 filed on Jun. 23, 2017, the entire contents of which are incorporated herein by reference.

FIELD

Exemplary embodiments of the present disclosure relate to a method of inspecting a gas supply system.

BACKGROUND

In manufacturing an electronic device, a substrate processing apparatus such as a plasma processing apparatus is used for processing a substrate. In general, the substrate processing apparatus includes a chamber body and a gas supply system. The chamber body provides an internal space as a chamber. The gas supply system supplies a gas to the chamber.

As the substrate processing apparatus, Japanese Patent Application Laid-Open Publication No. 2003-160870 describes a plasma processing apparatus including a gas supply system having a vaporizer. The vaporizer generates a processing gas by vaporizing a liquid. The processing gas generated by the vaporizer is supplied to the chamber through a gas supply line.

SUMMARY

According to an aspect, there is provided a method of inspecting a gas supply system of a substrate processing apparatus. The substrate processing apparatus includes a chamber body and the gas supply system. The chamber body provides an internal space as a chamber. The gas supply system is configured to supply a gas to the chamber. The gas supply system has a gas supply unit. The gas supply unit has a vaporizer, a primary valve, a flow rate controller, a secondary valve, and a pipe. The vaporizer is configured to generate a processing gas by vaporizing a liquid. The primary valve is connected to the vaporizer. The flow rate controller is provided on a secondary size of the primary valve, and is connected to the primary valve. The secondary valve is provided on a secondary side of the flow rate controller, and is connected to the flow rate controller. The pipe provides a gas supply line. The gas supply line connects a gas introduction port through which the processing gas is introduced to the chamber and the secondary valve with each other. The substrate processing apparatus further includes a pressure sensor and an exhaust device. The pressure sensor is configured to obtain a measurement value of a pressure of the gas supply line. The exhaust device is connected to the gas supply line. The method according to the aspect includes stopping supply of the processing gas to the gas supply line from the vaporizer, and monitoring a change of the measurement value obtained by the pressure sensor while the supply of the processing gas to the gas supply line from the vaporizer is stopped. The monitoring a change of the measurement value includes obtaining a decrease rate of the measurement value obtained by the pressure sensor while the supply of the processing gas to the gas supply line from the vaporizer is stopped and the gas supply line is exhausted by the exhaust device, or inspecting whether or not the measurement value obtained by the pressure sensor is increased in a state in which the gas supply line is not exhausted by the exhaust device while the supply of the processing gas to the gas supply line from the vaporizer is stopped.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

The processing gas generated by the vaporizer may be liquefied within the gas supply line. The processing gas may react due to residual moisture or the like to generate a solid within the gas supply line. Alternatively, the solid may be generated in a gas introduction port though which the processing gas is introduced to the chamber, due to the reaction of the processing gas from the vaporizer with a residual gas or a backflow gas from the chamber. In a case where the processing gas reacts to generate the solid within the gas supply line, a volume of the gas supply line is decreased. In a case where the solid is generated due to the reaction of the processing gas in the gas introduction port, a sectional area of the gas introduction port is decreased. As a result, the responsiveness of the processing gas supplied to the chamber is changed. The change in responsiveness of the processing gas supplied to the chamber influences a processing result of the substrate. Accordingly, there is a need for inspection of the gas supply system having the vaporizer.

According to an aspect, there is provided a method of inspecting a gas supply system of a substrate processing apparatus. The substrate processing apparatus includes a chamber body and the gas supply system. The chamber body provides an internal space as a chamber. The gas supply system is configured to supply a gas to the chamber. The gas supply system has a gas supply unit. The gas supply unit has a vaporizer, a primary valve, a flow rate controller, a secondary valve, and a pipe. The vaporizer is configured to generate a processing gas by vaporizing a liquid. The primary valve is connected to the vaporizer. The flow rate controller is provided on a secondary size of the primary valve, and is connected to the primary valve. The secondary valve is provided on a secondary side of the flow rate controller, and is connected to the flow rate controller. The pipe provides a gas supply line. The gas supply line connects a gas introduction port through which the processing gas is introduced to the chamber and the secondary valve with each other. The substrate processing apparatus further includes a pressure sensor and an exhaust device. The pressure sensor is configured to obtain a measurement value of a pressure of the gas supply line. The exhaust device is connected to the gas supply line. The method according to the aspect includes stopping supply of the processing gas to the gas supply line from the vaporizer, and monitoring a change of the measurement value obtained by the pressure sensor while the supply of the processing gas to the gas supply line from the vaporizer is stopped. The monitoring a change of the measurement value includes obtaining a decrease rate of the measurement value obtained by the pressure sensor while the supply of the processing gas to the gas supply line from the vaporizer is stopped and the gas supply line is exhausted by the exhaust device, or inspecting whether or not the measurement value obtained by the pressure sensor is increased in a state in which the gas supply line is not exhausted by the exhaust device while the supply of the processing gas to the gas supply line from the vaporizer is stopped.

When a solid is generated due to reaction of the processing gas supplied to the chamber within the gas supply line, a volume of the gas supply line becomes small. In a case where the volume of the gas supply line becomes small, when the gas supply line is exhausted by the exhaust device in a state in which the supply of the processing gas to the gas supply line is stopped, the decrease rate of the measurement value of the pressure of the gas supply line becomes high. In a case where the solid is generated due to the reaction of the processing gas only in the gas introduction port, when the gas supply line is exhausted by the exhaust device in a state in which the supply of the processing gas to the gas supply line from the vaporizer is stopped, the decrease rate of the measurement value of the pressure of the gas supply line becomes low. In accordance with the method according to the aspect, it is possible to inspect the gas supply system for a state of the gas supply line and a state of the gas introduction port, in the case where such a decrease rate is obtained.

In a case where the measurement value of the pressure of the gas supply line is increased in a state in which the supply of the processing gas to the gas supply line is stopped and the gas supply line is not exhausted by the exhaust device, the liquefied processing gas is present within the gas supply line. Therefore, according to the method according to the aspect, it is possible to inspect, during stop of the supply of the processing gas, whether or not the processing gas was reliquefied within the gas supply line during supply of the processing gas from the vaporizer, in a case where it is inspected whether or not the measurement value is increased.

In one embodiment, the method further includes comparing the decrease rate with a predetermined value. For example, the predetermined value may be the decrease rate of the measurement value of the pressure of the gas supply line in a state in which the solid is not generated from the processing gas in the gas supply line and the gas introduction port. In a case where the decrease rate is greater than the predetermined value, it is detected that the solid is generated due to the reaction of the processing gas within the gas supply line. In a case where the decrease rate is less than the predetermined value, it is detected that the solid is generated due to the reaction of the processing gas in the gas introduction port.

In one embodiment, the method further includes exhausting the gas supply line by the exhaust device in a state in which the supply of the processing gas to the gas supply line from the vaporizer is stopped and a control valve of the flow rate controller is closed, obtaining a first measurement value of the pressure of the gas supply line by the pressure sensor in a state in which the exhausting of the gas supply line by the exhaust device is stopped and the control valve and the secondary valve are closed after the exhausting the gas supply line, obtaining a second measurement value of the pressure of the gas supply line by the pressure sensor in a state in which the exhausting of the gas supply line by the exhaust device is stopped, the control valve is closed, and the secondary valve is opened, after the obtaining a first measurement value, and comparing the first measurement value with the second measurement value. In a case where the control valve leaks even though the control valve is closed, there is a difference between the first measurement value and the second measurement value. Therefore, according to the embodiment, it is possible to inspect whether or not the control valve of the flow rate controller leaks.

Hereinafter, various embodiments will be described in detail with reference to the drawings. In the drawing, the same or equivalent portions are denoted by the same reference symbols.

Figure 1:
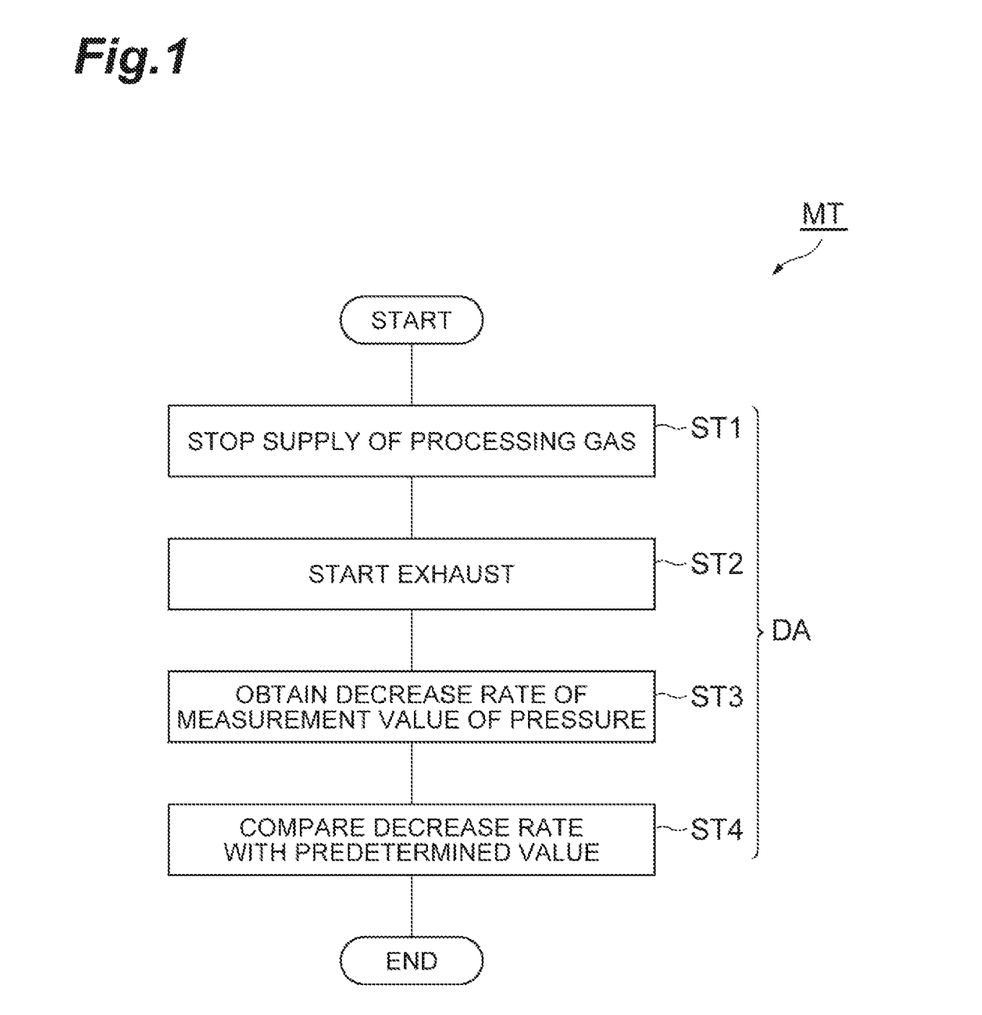
FIG. 1 is a flowchart illustrating a method of inspecting a gas supply system according to an exemplary embodiment.
Figure 2:
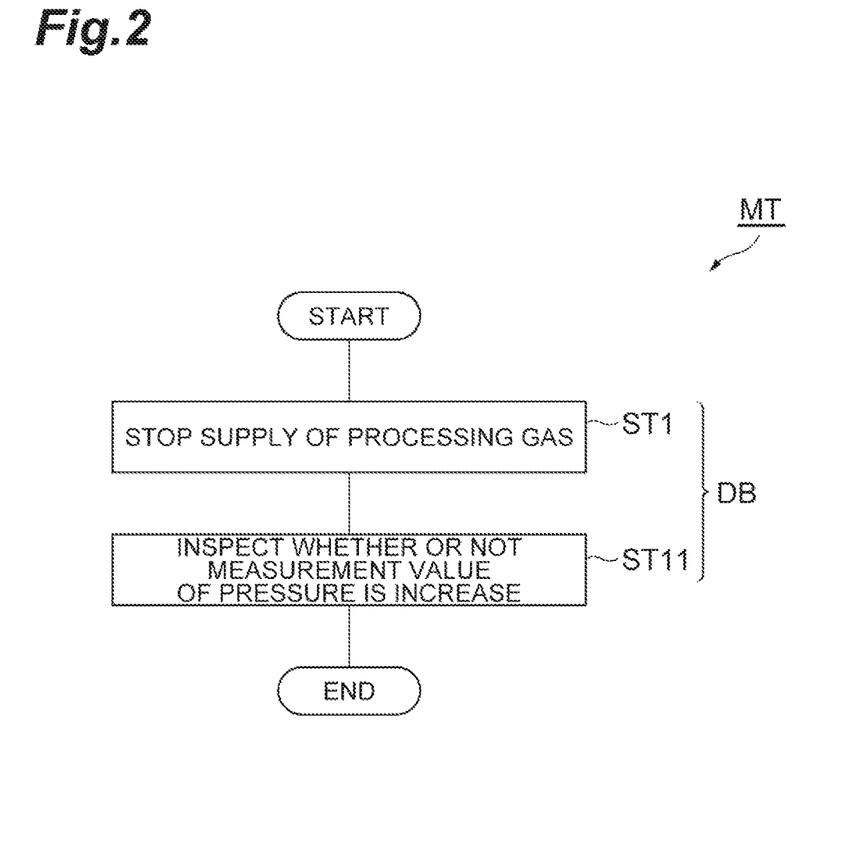
FIG. 2 is a flowchart illustrating a method of inspecting the gas supply system according to an exemplary embodiment.
Figure 3:
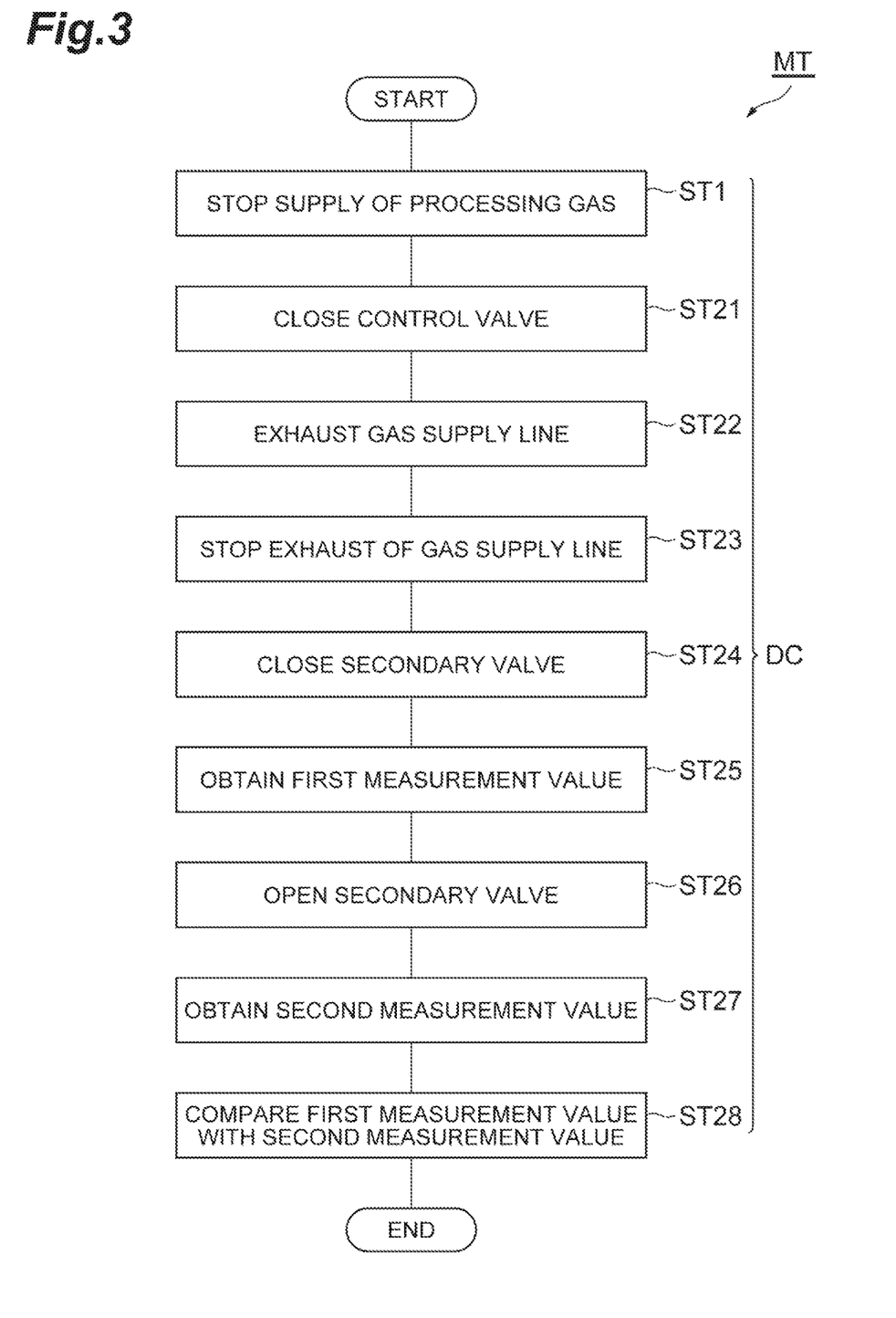
FIG. 3 is a flowchart illustrating a method of inspecting the gas supply system according to an exemplary embodiment.

FIGS. 1, 2, and 3 are flowcharts illustrating a method of inspecting a gas supply system according to an exemplary embodiment. A method MT of inspecting the gas supply system according to the embodiment includes an inspection process DA shown in FIG. 1. The method MT may further include an inspection process DB shown in FIG. 2 and an inspection process DC shown in FIG. 3. The method MT is performed in order to inspect a gas supply system of a substrate processing apparatus. The gas supply system is configured to supply a processing gas generated from a liquid to a chamber. The method MT is performed in order to inspect the gas supply system while the supply of the processing gas to the chamber is stopped.

Figure 4:
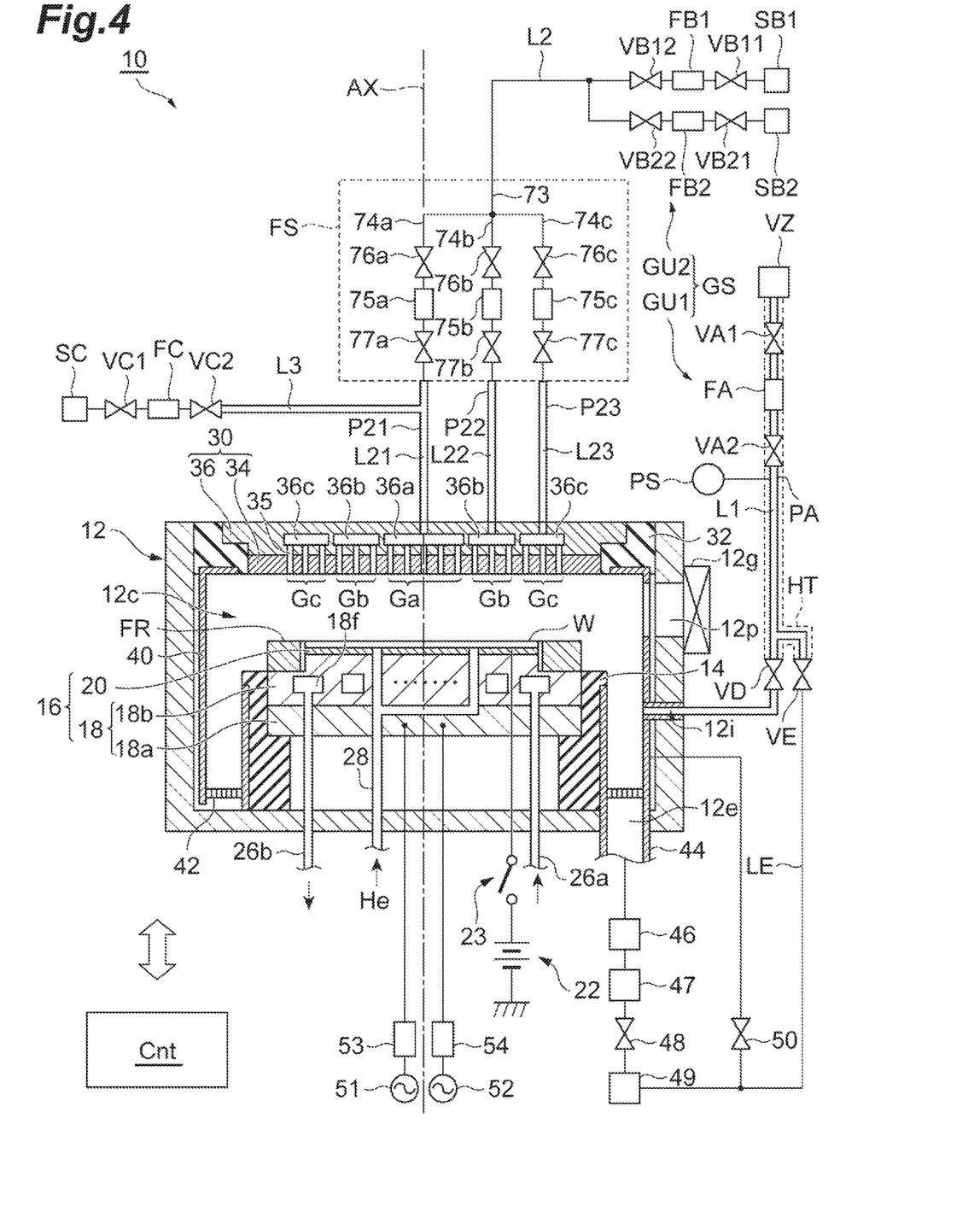
FIG. 4 schematically illustrates a plasma processing apparatus which is a substrate processing apparatus according to an exemplary embodiment.

FIG. 4 schematically illustrates a plasma processing apparatus which is the substrate processing apparatus according to an exemplary embodiment. A plasma processing apparatus 10 according to the embodiment shown in FIG. 4 is a capacitively coupled plasma processing apparatus 10. The plasma processing apparatus 10 includes a chamber body 12. The chamber body 12 has a substantially cylindrical shape. A central axis line of the chamber body 12 substantially coincides with an axis AX that extends in a vertical direction. The chamber body 12 provides an internal space thereof as a chamber 12c. The chamber body 12 is formed of, for example, aluminum. An anodizing process is performed on an inner wall surface of the chamber body 12. The chamber body 12 is grounded. A passageway 12p is formed in a sidewall of the chamber body 12. When a substrate W is transferred in the chamber 12c and is transferred out from the chamber 12c, the substrate passes through the passageway 12p. The substrate W may have a substantially disc shape such as a wafer. A gate valve 12g is provided along the sidewall of the chamber body 12 in order to open or close the passageway 12p.

A support 14 is provided on a bottom of the chamber body 12. The support 14 is formed of, for example, an insulating material. The support 14 has a substantially cylindrical shape. The support 14 extends from the bottom of the chamber body 12 in the vertical direction within the chamber 12c. A stage 16 is provided within the chamber 12c. The stage 16 is supported by a support 14.

The stage 16 supports the substrate W on a top surface thereof. The stage 16 has a lower electrode 18 and an electrostatic chuck 20. The lower electrode 18 includes a first plate 18a and a second plate 18b. The first plate 18a and the second plate 18b are formed of, for example, metal such as aluminum, and have substantially disc shapes. The second plate 18b is provided on the first plate 18a, and is electrically connected to the first plate 18a.

The electrostatic chuck 20 is provided on the second plate 18b. The electrostatic chuck 20 has an insulation layer and an electrode which is a conductive film embedded in the insulating film. A direct current power supply 22 is electrically connected to the electrode of the electrostatic chuck 20 through a switch 23. The substrate W is mounted on the electrostatic chuck 20. When a voltage from the direct current power supply 22 is applied to the electrode of the electrostatic chuck 20, electrostatic attractive force is generated between the electrostatic chuck 20 and the substrate W. The substrate W is attracted to the electrostatic chuck 20 due to the generated electrostatic attractive force. Accordingly, the substrate W is held by the electrostatic chuck 20.

A focus ring FR is disposed on a peripheral portion of the second plate 18b so as to surround an edge of the substrate W. The focus ring FR is provided in order to improve uniformity in plasma processing. For example, the focus ring FR may be made of a material such as silicon, quartz, or SiC.

A flow passage 18f is formed in the second plate 18b. A coolant is supplied to the flow passage 18f through a pipe 26a from a chiller unit provided outside the chamber body 12. The coolant supplied to the flow passage 18f is returned to the chiller unit through a pipe 26b. A temperature of the coolant to be supplied to the flow passage 18f is controlled, and thus, a temperature of the substrate W mounted on the electrostatic chuck 20 is controlled.

A gas supply line 28 is provided in the plasma processing apparatus 10. The gas supply line 28 supplies a heat transfer gas from a heat transfer gas supply mechanism, for example, a He gas between a top surface of the electrostatic chuck 20 and a rear surface of the substrate W.

The plasma processing apparatus 10 further includes a gas delivery portion 30. The gas delivery portion 30 is configured to deliver the gas to the chamber 12c. The gas delivery portion 30 configures an upper electrode. The gas delivery portion 30 is provided above the stage 16 through a space within the chamber 12c. The gas delivery portion 30 is supported by an upper portion of the chamber body 12 through a member 32. The member 32 may have insulation properties.

The gas delivery portion 30 has a shower plate 34 and a support member 36. The shower plate 34 is provided above the stage 16. A bottom surface of the shower plate 34 faces the chamber 12c. The shower plate 34 may be formed of, for example, silicon or silicon oxide. Alternatively, the shower plate 34 may be formed by coating a conductive basic material (for example, aluminum) with ceramics.

A plurality of gas delivery outlets 35 is formed in the shower plate 34. The plurality of gas delivery outlets 35 penetrates the shower plate 34 in a thickness direction of the shower plate 34. In one embodiment, the plurality of gas delivery outlets 35 configures a plurality of gas delivery outlet groups Ga, Gb, and Gc. That is, some gas delivery outlets among the plurality of gas delivery outlets 35 configures the gas delivery outlet group Ga, other gas delivery outlets of the plurality of gas delivery outlets 35 configures the gas delivery outlet group Gb, and still other gas delivery outlets of the plurality of gas delivery outlets 35 configures the gas delivery outlet group Ge. The number of gas delivery outlet groups may be an arbitrary number.

The gas delivery outlets 35 of the gas delivery outlet group Ga, the gas delivery outlets 35 of the gas delivery outlet group Gb, and the gas delivery outlets 35 of the gas delivery outlet group Ge are respectively formed in a plurality of regions of the shower plate 34 which extend coaxially around the axis AX. Specifically, the gas delivery outlets 35 of the gas delivery outlet group Ga are formed in a region crossing the axis AX. The gas delivery outlets 35 of the gas delivery outlet group Gb are formed in a region outside the region in which the gas delivery outlets 35 of the gas delivery outlet group Ga are formed. The gas delivery outlets 35 of the gas delivery outlet group Gc are formed in a region outside the region in which the gas delivery outlets 35 of the gas delivery outlet group Gb are formed.

The support member 36 is configured to detachably support the shower plate 34. The support member 36 is formed of, for example, a conductive material such as aluminum. A plurality of gas diffusion spaces 36a, 36b, and 36c are formed in the support member 36. The plurality of gas diffusion spaces 36a, 36b, and 36c are provided coaxially around the axis AX, and are separated from one another. The gas diffusion space 36a is formed in a region crossing the axis AX. The gas diffusion space 36b is formed to extend in a circumferential direction around the axis AX outside the gas diffusion space 36. The gas diffusion space 36c is formed to extend in the circumferential direction around the axis AX outside the gas diffusion space 36b. The number of gas diffusion spaces may be equal to the number of gas delivery outlet groups.

A plurality of holes are formed in the support member 36. The plurality of holes extend downwards from the gas diffusion spaces 36a, 36b, and 36c and are communicatively connected to the plurality of gas delivery outlets 35, respectively. Accordingly, the gas delivery outlets 35 of the gas delivery outlet group Ga are connected to the gas diffusion space 36a, the gas delivery outlets 35 of the gas delivery outlet group Gb are connected to the gas diffusion space 36b, and the gas delivery outlets 35 of the gas delivery outlet group Gc are connected to the gas diffusion space 36c.

In the plasma processing apparatus 10, a shield 40 is detachably provided along an inner wall of the chamber body 12. The shield 40 is also provided on a circumference of the support 14. The shield 40 prevents by-products in the plasma processing from adhering to the chamber body 12. For example, the shield 40 may be formed by coating an aluminum material with ceramics such as $Y_2O_3$.

A baffle plate 42 is provided in a bottom side of the chamber body 12 and between the support 14 and the sidewall of the chamber body 12. For example, the baffle plate 42 may be formed by coating an aluminum material with ceramics such as $Y_2O_3$. A plurality of through-holes is formed in the baffle plate 42. An exhaust port 12e is formed under the baffle plate 42 in the chamber body 12. An automatic pressure control valve 46 is connected to the exhaust port 12e through an exhaust pipe 44. An exhaust device 47 is connected to the exhaust pipe 44 through the automatic pressure control valve 46. For example, the exhaust device 47 is a turbo molecular pump. Another exhaust device 49 is connected to the exhaust device 47 through a valve 48. For example, the exhaust device 49 is a dry pump. The exhaust device 49 is connected to the chamber 12c through a valve 50.

The plasma processing apparatus 10 further includes a first radio-frequency power supply 51 and a second radio-frequency power supply 52. The first radio-frequency power supply 51 is a power supply that generates a first radio-frequency wave for plasma generation. For example, a frequency of the first radio-frequency wave is a frequency in a range of 27 to 100 MHz. The first radio-frequency power supply 51 is connected to the lower electrode 18 through a matching unit 53. The matching unit 53 has a circuit for matching an output impedance of the first radio-frequency power supply 51 and an impedance of a load side (lower electrode 18). The first radio-frequency power supply 51 may be connected to the upper electrode through the matching unit 53.

The second radio-frequency power supply 52 is a power supply that generates a second radio-frequency wave for attracting ions to the substrate W, that is, a radio-frequency wave for bias. For example, a frequency of the second radio-frequency wave is a frequency in a range of 400 kHz to 13.56 MHz. The second radio-frequency power supply 52 is connected to the lower electrode 18 through a matching unit 54. The matching unit 54 has a circuit for matching an output impedance of the second radio-frequency power supply 52 and the impedance of the load side (lower electrode 18).

The plasma processing apparatus 10 further includes a gas supply system GS. The gas supply system GS has a gas supply unit GU1 (first gas supply unit). The gas supply system GS may further have a gas supply unit GU2 (second gas supply unit) and a flow splitter FS.

The gas supply unit GU1 has a vaporizer VZ, a primary valve VA1 a flow rate controller FA, a secondary valve VA2, and a pipe PA. The pipe PA provides a gas supply line L1. The gas supply line L1 is connected to the chamber 12c. In one embodiment, the gas supply line L1 is connected to the chamber 12c through a valve VD. A gas supplied from the gas supply line L1 is introduced to the chamber 12c from a gas introduction port 12i.

The vaporizer VZ vaporizes a liquid to generate a processing gas. The vaporizer VZ may have a tank that stores a liquid therein and a heating device for vaporizing the liquid in the tank. The processing gas (hereinafter, referred to as a "first processing gas") generated by the vaporizer VZ is a gas deposited on the substrate W. In a case where a silicon-based material is deposited on the substrate W, the first processing gas may be, for example, an aminosilane-based gas. In a case where the substrate W has a porous film and pores in the porous film are to be filled with the liquid, the first processing gas is a gas to be liquefied through capillary condensation, for example, a fluorocarbon-based gas, a hydrocarbon gas, or a gas including alcohol such as isopropyl alcohol.

In the plasma processing apparatus 10, the deposition of particles configuring the first processing gas on the substrate W or in the substrate W and plasma etching on the substrate W using a second processing gas to be described below may be performed. In the plasma processing apparatus 10, the deposition of particles configuring the first processing gas on the substrate W or in the substrate W and plasma etching on the substrate W using a second processing gas may be alternately performed.

The primary valve VA1 is connected to the vaporizer VZ. The flow rate controller FA is provided on a downstream side of the primary valve VA1, that is, on the secondary side. The flow rate controller FA is connected to the primary valve VA1. In one embodiment, the flow rate controller FA is a mass flow controller.

Figure 5:
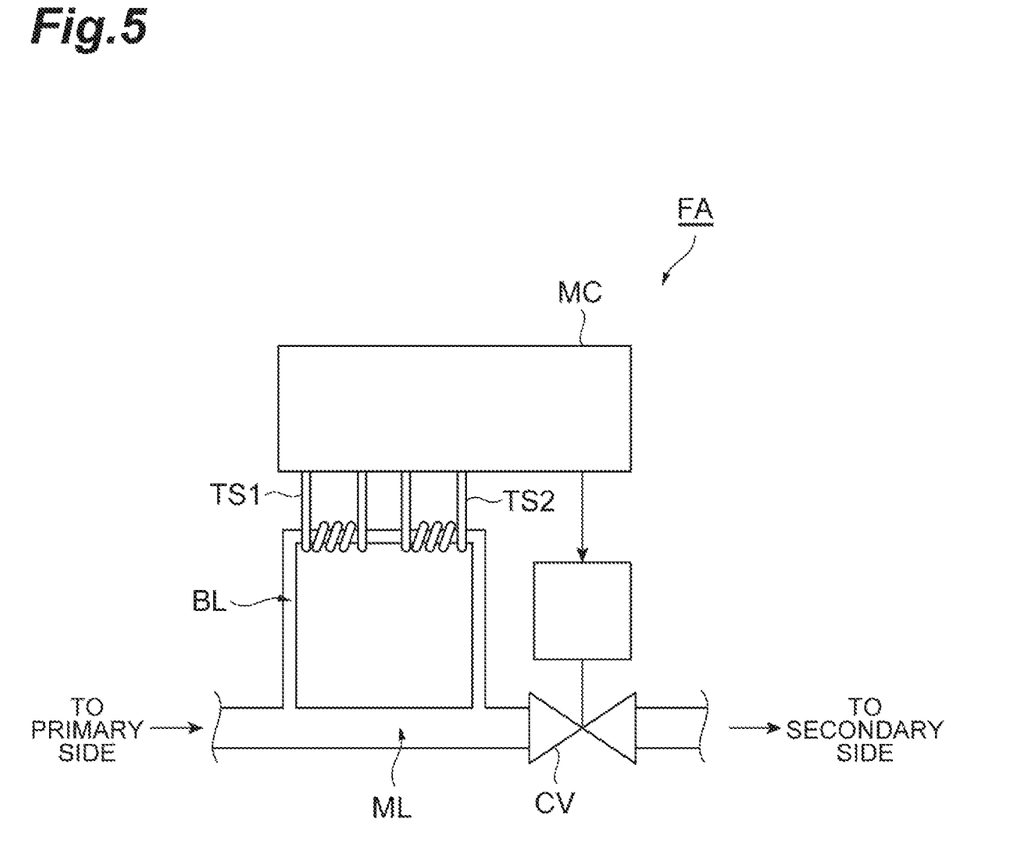
FIG. 5 schematically illustrates a mass flow controller as an example.

FIG. 5 schematically illustrates the mass flow controller as an example. The flow rate controller FA may be the mass flow controller shown in FIG. 5. The flow rate controller FA shown in FIG. 5 has a control valve CV, a controller MC, a temperature sensor TS1, and a temperature sensor TS2. The flow rate controller FA has a main gas line ML that extends between the primary side and the secondary side. A branch line BL is branched from the main gas line ML. The branch line BL is connected to the main gas line ML again at a confluence on a downstream side of the branched portion between the main gas line ML and the branch line BL. A part of the gas flowing to the main gas line ML from the primary side flows to the branch line BL, and flows into the main gas line ML at the confluence of the main gas line ML and the branch line BL again. The temperature sensor TS1 and the temperature sensor TS2 are provided in order along the branch line BL. The temperature sensor TS1 and the temperature sensor TS2 are configured to measure a temperature of the branch line BL. The control valve CV is provided on the secondary side of the branch line BL and on the main gas line ML. The controller MC is configured to determine a flow rate from a difference between the temperature measured by the temperature sensor TS1 and the temperature measured by the temperature sensor TS2 and to control an opening degree of the control valve CV to decrease an error between the determined flow rate and a set flow rate.

The secondary valve VA2 is provided on the secondary side of the flow rate controller FA. The secondary valve VA2 is connected to the flow rate controller FA. The gas supply line L1 is connected to the secondary valve VA2.

The exhaust device 49 is connected to the gas supply line L1. Specifically, an exhaust line LE that extends from the exhaust device 49 is connected to the gas supply line L1 through a valve VE. The exhaust line LE is connected to the gas supply line L1 between the valve VD and the secondary valve VA2. It should be noted that a different exhaust device which is not connected to the chamber 12c may be connected to the gas supply line L1, instead of the exhaust device 49 which is connected to the chamber 12c.

The plasma processing apparatus 10 further includes a pressure sensor PS. The pressure sensor PS is configured to obtain a measurement value of a pressure of the gas supply line L1. The pressure sensor PS is provided so as to measure the pressure of the gas supply line L1 between the secondary valve VA2 and the valve VD.

In one embodiment, a heater HT is attached to the pipe PA. The heater HT heats the pipe PA so as to prevent the first processing gas from being liquefied within the gas supply line L1. As shown in FIG. 4, the heater HT may be provided so as to heat a pipe that provides a gas line from the vaporizer VZ to the valve VD and a gas line from the gas supply line L1 to the valve VE.

The gas supply unit GU2 is configured to supply the second processing gas and an inert gas. For example, the second processing gas is a processing gas for etching a film of the substrate W, and includes, for example, a fluorocarbon-based gas. The inert gas is a nitrogen gas or a rare gas.

In one embodiment, the gas supply unit GU2 has a primary valve VB11, a flow rate controller FB1, a secondary valve VB12, a primary valve VB21, a flow rate controller FB2, and a secondary valve VB22. A pressure control type flow controller or a mass flow controller may be used as the flow rate controller FB1. The flow rate controller FB1 is connected to a gas source SB1 through the primary valve VB11. The gas source SB1 is a source of the second processing gas. The flow rate controller FB1 is connected to a gas supply line L2 through the secondary valve VB12.

A pressure control type flow controller or a mass flow controller may be used as the flow rate controller FB2. The flow rate controller FB2 is connected to the gas source SB2 through the primary valve VB21. The gas source SB2 is a source of the inert gas. The flow rate controller FB2 is connected to the gas supply line L2 through the secondary valve VB22. The gas supply line L2 is connected to an input of the flow splitter FS on the downstream side thereof.

The flow splitter FS has a plurality of outputs, and a plurality of gas supply lines L21, L22, and L23 is connected to the plurality of outputs. The plurality of gas supply lines L21, L22, and L23 is provided by a plurality of pipes P21, P22, and P23, respectively. The number of outputs of the flow splitter FS is equal to the number of gas delivery outlet groups. The flow splitter FS is configured to distribute the gas supplied to the input thereof to the plurality of gas supply lines L21, L22, and L23.

A common gas line 73 extends from the input within the flow splitter FS. The gas line 73 is branched to a plurality of gas lines 74a, 74b, and 74c. The plurality of gas lines 74a, 74b, and 74c is connected to the plurality of gas supply lines L21, L22, and L23. The plurality of gas supply lines L21, L22, and L23 is connected to the plurality of gas delivery outlet groups Ga, Gb, and Gc through the gas diffusion spaces 36a, 36b, and 36c.

A primary valve 76a, a flow rate controller 75a, and a secondary valve 77a are provided on the gas line 74a. A primary valve 76b, a flow rate controller 75b, and a secondary valve 77b are provided on the gas line 74b. A primary valve 76c, a flow rate controller 75c, and a secondary valve 77c are provided on the gas line 74c. The flow rate controller 75a, the flow rate controller 75b, and the flow rate controller 75c may be mass flow controllers, respectively.

In one embodiment, a flow rate controller FC is connected to the gas supply line L21 through a secondary valve VC2. The flow rate controller FC may be a pressure control type flow rate controller. The flow rate controller FC is connected to a gas source SC through a primary valve VC1. The flow rate controller FC may be connected to an arbitrary gas supply line of the plurality of gas supply lines L21, L22, and L23.

In one embodiment, the plasma processing apparatus 10 further includes a controller Cnt. The controller Cnt is a computer that includes a processor, a storage device, an input device, and a display device. The controller Cnt controls the units of the plasma processing apparatus 10 for the plasma processing performed by the plasma processing apparatus 10. The controller Cnt may control the units of the plasma processing apparatus 10 in the performing of the method MT, and may perform an operation to be described below in the method MT.

The method MT will be described by referring to FIGS. 1 to 3 again. Before the inspection process of the method MT is performed, the first processing gas is supplied to the chamber 12c through the gas supply line L1 and the gas introduction port 12i from the vaporizer VZ, and the substrate W is processed. In step ST1 of the method MT, the supply of the first processing gas to the gas supply line L1 from the vaporizer VZ is stopped. In step ST1, at least the primary valve VA1 is closed.

In the inspection process DA shown in FIG. 1, step ST2, step ST3, and step ST4 are performed subsequently to step ST1. Step ST2 and step ST3 are performed while the supply of the first processing gas to the gas supply line L1 from the vaporizer VZ is stopped. During execution of step ST2 and step ST3, the valve VD and the valve VE are opened. During execution of step ST2 and step ST3, the secondary valve VA2 and the control valve CV of the flow rate controller FA may be closed.

In step ST2, the exhausting of the gas supply line L1 is started. Specifically, the gas within the gas supply line L1 is discharged by the exhaust device 49 or a different exhaust device. In Step ST3, a change of a measurement value of the pressure obtained by the pressure sensor PS is monitored. Step ST3 is performed while step ST2 is performed. That is, step ST3 is performed while the supply of the first processing gas to the gas supply line L1 from the vaporizer VZ is stopped and the gas supply line L1 is exhausted by the exhaust device 49 or the different exhaust device. Specifically, in step ST3, a decrease rate of a measurement value of the pressure obtained by the pressure sensor PS is obtained. The decrease rate is expressed by a decrease amount per unit time of the measurement value of the pressure obtained by the pressure sensor PS or a time taken until the measurement value obtained by the pressure sensor PS are decreased to a predetermined value.

In subsequent Step ST4, the decrease rate obtained in step ST3 is compared with the predetermined value. For example, the predetermined value is a decrease rate of the measurement value of the pressure of the gas supply line L1 obtained similarly to the decrease rate obtained in step ST3, and is a decrease rate obtained in a state in which a solid is not generated from the first processing gas in the gas supply line L1 and the gas introduction port 12i. In a case where the decrease rate is greater than the predetermined value, it is detected that the solid is generated from the first processing gas and the solid is attached to a surface of the pipe within the gas supply line L1. In a case where the decrease rate is less than the predetermined value, it is detected that the first processing gas reacts and the solid is generated only in the gas introduction port 12i.

When a solid is generated due to the reaction of the first processing gas supplied to the chamber 12c within the gas supply line L1, a volume of the gas supply line L1 becomes small. In a case where the volume of the gas supply line L1 becomes small, when the gas supply line L1 is exhausted by the exhaust device 49 or the different exhaust device in a state in which the supply of the first processing gas to the gas supply line L1 is stopped, the decrease rate of the measurement value of the pressure of the gas supply line L1 becomes high. In a case where the solid is generated due to the reaction of the first processing gas only in the gas introduction port 12i, when the gas supply line L1 is exhausted by the exhaust device 49 or the different exhaust device in a state in which the supply of the first processing gas to the gas supply line L1 from the vaporizer VZ is stopped, the decrease rate of the measurement value of the pressure of the gas supply line L1 becomes low. According to the inspection process DA, since the decrease rate is obtained, it is possible to inspect the gas supply system GS for a state of the gas supply line L1 and a state of the gas introduction port 12i.

As shown in FIG. 2, as is the case with the inspection process DA, step ST1 is performed in the inspection process DB. That is, the supply of the first processing gas to the gas supply line L1 from the vaporizer VZ is stopped. In step ST1, at least the primary valve VA1 is closed.

In the inspection process DB, step ST11 is performed subsequently to step ST1. Step ST11 is performed while the supply of the first processing gas to the gas supply line L1 from the vaporizer VZ is stopped. During execution of step ST11, the secondary valve VA2 and the control valve CV of the flow rate controller FA may be closed. During execution of step ST11, the valve VD and the valve VE may be closed, and the gas supply line L1 may not be exhausted by the exhaust device.

In step ST11, a change of a measurement value of the pressure obtained by the pressure sensor PS is monitored. Specifically, in step ST11, it is inspected whether or not the measurement value of the pressure of the gas supply line L1 obtained by the pressure sensor PS is increased. In a case where the measurement value of the pressure of the gas supply line L1 is increased in a state in which the supply of the first processing gas to the gas supply line L1 is stopped and the gas supply line L1 is not exhausted by the exhaust device, it can be proven that the first processing gas was reliquefied within the gas supply line L1 before the supply of the first processing gas from the vaporizer VZ is stopped. Therefore, according to the inspection process DB, it is possible to inspect, during stop of supply of the first processing gas, whether or not the first processing gas was reliquefied within the gas supply line during supply of the first processing gas from the vaporizer VZ.

As shown in FIG. 3, as is the case with the inspection process DA, step ST1 is performed in the inspection process DC. That is, the supply of the first processing gas to the gas supply line L1 from the vaporizer VZ is stopped. In step ST1, at least the primary valve VA1 is closed. In the inspection process DC, step ST21 to step ST28 are performed subsequently to step ST1. Step ST21 to step ST27 are performed while the supply of the first processing gas to the gas supply line L1 from the vaporizer VZ is stopped. During execution of step ST23 to step ST27, the valve VD and the valve VE are closed.

In step ST21, the control valve CV of the flow rate controller FA is closed. The control valve CV is closed during execution of step ST21 to step ST27. The secondary valve VA2 is opened during execution of step ST21 to step ST23. In step ST22 subsequent to step ST21, the gas supply line L1 is exhausted by the exhaust device 49 or the different exhaust device. In subsequent step ST23, the exhausting of the gas supply line L1 performed in step ST22 is stopped. The stoppage of the exhausting of the gas supply line L1 started in step ST23 is continued until the end of step ST27.

In subsequent step ST24, the secondary valve VA2 is closed. In subsequent step ST25, the measurement value of the pressure of the gas supply line L1, that is, a first measurement value is obtained by the pressure sensor PS. That is, in step ST25, the first measurement value is obtained in a state in which the exhausting of the gas supply line L1 using the exhaust device is stopped and the control valve CV of the flow rate controller FA and the secondary valve VA2 are closed.

In subsequent ST26, the secondary valve VA2 is opened. In subsequent ST27, the measurement value of the pressure of the gas supply line L1, that is, a second measurement value is obtained by the pressure sensor PS. That is, in step ST27, in a state in which the exhausting of the gas supply line L1 using the exhaust device is stopped, the control valve CV of the flow rate controller FA is closed, and the secondary valve VA2 is opened, the second measurement value is obtained. In subsequent process ST28, the first measurement value and the second measurement value are compared.

In a case where the control valve CV leaks even though the control valve CV of the flow rate controller FA is closed, there is a difference between the first measurement value and the second measurement value. Therefore, according to the inspection process DC, it is possible to inspect whether or not the control valve CV of the flow rate controller FA leaks.

Hereinbefore, various embodiments are described. However, various modifications may be made without being limited to the above-described embodiments. For example, the method MT may be applied to any substrate processing apparatus including a gas supply system having a vaporizer. The method MT is not limited to be used for capacitively coupled plasma processing apparatus, and may be used for inspecting a gas supply system of any plasma processing apparatus such as an inductively coupled plasma processing apparatus or a plasma processing apparatus using surface waves such as microwaves.

In another embodiment, the method of inspecting a gas supply system may include one or more processes among the inspection process DA, the inspection process DB and the inspection process DC, instead of all the inspection process DA, the inspection process DB and the inspection process DC.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of inspecting a gas supply system of a substrate processing apparatus, the method comprising:
    providing the substrate processing apparatus which includes:
        a chamber body providing a chamber; and
        the gas supply system configured to supply a gas to the chamber,
    the gas supply system having a gas supply unit,
    the gas supply unit including:
        a vaporizer configured to generate a processing gas by vaporizing a liquid;
        a primary valve connected to the vaporizer;
        a flow rate controller provided on a secondary side of the primary valve and connected to the primary valve;
        a secondary valve provided on a secondary side of the flow rate controller and connected to the flow rate controller; and
        a pipe providing a gas supply line which connects a gas introduction port through which the processing gas is introduced to the chamber and the secondary valve with each other,
    the substrate processing apparatus further including:
        a pressure sensor configured to obtain a measurement value of a pressure of the gas supply line; and
        an exhaust device connected to the gas supply line,
    stopping supply of the processing gas to the gas supply line from the vaporizer; and
    monitoring a change of the measurement value obtained by the pressure sensor while the supply of the processing gas to the gas supply line from the vaporizer is stopped,
    wherein said monitoring a change of the measurement value includes obtaining a decrease rate of the measurement value obtained by the pressure sensor while the supply of the processing gas to the gas supply line from the vaporizer is stopped and the gas supply line is exhausted by the exhaust device, or inspecting whether or not the measurement value obtained by the pressure sensor is increased in a state in which the gas supply line is not exhausted by the exhaust device while the supply of the processing gas to the gas supply line from the vaporizer is stopped.

2. The method of inspecting a gas supply system according to claim 1, wherein the decrease rate of the measurement value is obtained in said monitoring a change of the measurement value, and the method further comprises comparing the decrease rate with a predetermined value.

3. The method of inspecting a gas supply system according to claim 2, further comprising:

inspecting whether or not the measurement value obtained by the pressure sensor is increased in a state in which the gas supply line is not exhausted by the exhaust device while the supply of the processing gas to the gas supply line from the vaporizer is stopped.

4. The method of inspecting a gas supply system according to claim 1, further comprising:

exhausting the gas supply line by the exhaust device in a state in which the supply of the processing gas to the gas supply line from the vaporizer is stopped and a control valve of the flow rate controller is closed;

obtaining a first measurement value of the pressure of the gas supply line by the pressure sensor in a state in which the exhausting of the gas supply line by the exhaust device is stopped and the control valve and the secondary valve are closed after said exhausting the gas supply line;

obtaining a second measurement value of the pressure of the gas supply line by the pressure sensor in a state in which the exhausting of the gas supply line by the exhaust device is stopped, the control valve is closed, and the secondary valve is opened, after said obtaining a first measurement value is performed; and comparing the first measurement value with the second measurement value.

* * * * *